United States Patent
Li et al.

(10) Patent No.: US 11,508,505 B2
(45) Date of Patent: Nov. 22, 2022

(54) SUPERCONDUCTING COIL HAVING SPIRAL STRUCTURE FOR CURRENT LIMITER

(71) Applicants: GUANGDONG POWER GRID CO., LTD., Guangdong (CN); ELECTRIC POWER RESEARCH INSTITUTE OF GUANGDONG POWER GRID CO., LTD., Guangdong (CN)

(72) Inventors: Li Li, Guangdong (CN); Lianhong Zhong, Guangdong (CN); Meng Song, Guangdong (CN); Xinhui Duan, Guangdong (CN); Xiaoqing Xiao, Guangdong (CN); Nannan Hu, Guangdong (CN); Yunsong Luo, Guangdong (CN); Wenfeng Cheng, Guangdong (CN); Zhengjun Shi, Guangdong (CN); Bing Zhao, Guangdong (CN); Yajun Xia, Guangdong (CN); Youxin Lin, Guangdong (CN)

(73) Assignees: GUANGDONG POWER GRID CO., LTD., Guangdong (CN); ELECTRIC POWER RESEARCH INSTITUTE OF GUANGDONG POWER GRID CO., LTD., Guangdong (CN)

( * ) Notice: Subject to any disclaimer, the term of this patent is extended or adjusted under 35 U.S.C. 154(b) by 150 days.

(21) Appl. No.: 16/972,513

(22) PCT Filed: Aug. 16, 2019

(86) PCT No.: PCT/CN2019/100940
§ 371 (c)(1),
(2) Date: Dec. 4, 2020

(87) PCT Pub. No.: WO2020/035044
PCT Pub. Date: Feb. 20, 2020

(65) Prior Publication Data
US 2021/0272730 A1    Sep. 2, 2021

(30) Foreign Application Priority Data
Aug. 17, 2018 (CN) .......................... 201810942162.5

(51) Int. Cl.
*H01F 6/06* (2006.01)
*H01F 6/00* (2006.01)

(52) U.S. Cl.
CPC ......... *H01F 6/06* (2013.01); *H01F 2006/001* (2013.01)

(58) Field of Classification Search
CPC ............................ H01F 6/06; H01F 2006/001
(Continued)

(56) References Cited

U.S. PATENT DOCUMENTS 5,310,705 A * 5/1994 Mitlitsky .................. H01F 6/06
505/879
5,426,408 A * 6/1995 Jones ........................ H01F 6/06
505/211
(Continued)

FOREIGN PATENT DOCUMENTS

CN 101331560 12/2008
CN 103117145 5/2013
(Continued)

OTHER PUBLICATIONS

PCT/CN2019/100940 International Search Report dated Nov. 25, 2019.

Primary Examiner — Alexander Talpalatski
(74) Attorney, Agent, or Firm — Michael Best & Friedrich LLP

(57) ABSTRACT

Provided is a superconducting coil having a spiral structure for a current limiter. The coil includes: a first superconduct-
(Continued)

ing tape, a second superconducting tape, and an insulating isolation layer, where the first superconducting tape and the second superconducting tape have spiral structures, an end of the first superconducting tape at a spiral center is connected to an end of the second superconducting tape at the spiral center, the instating isolation laser is filled between the first superconducting tape and the second superconducting tape, and a spacing between the first superconducting tape and the second superconducting tape gradually increases from the spiral center to an outer spiral periphery.

8 Claims, 2 Drawing Sheets

(58) Field of Classification Search
USPC .......................................................... 335/216
See application file for complete search history.

(56) References Cited

U.S. PATENT DOCUMENTS

| | | | |
|---|---|---|---|
| 2011/0116198 A1* | 5/2011 | Kramer | H01F 27/2871 505/150 |
| 2017/0025209 A1* | 1/2017 | Stemmle | H01L 39/16 |

FOREIGN PATENT DOCUMENTS

| | | |
|---|---|---|
| CN | 108899157 | 11/2018 |
| CN | 208521719 | 2/2019 |

* cited by examiner

SUPERCONDUCTING COIL HAVING SPIRAL STRUCTURE FOR CURRENT LIMITER

CROSS-REFERENCES TO RELATED APPLICATIONS

This is a National Stage Application, filed under 35 U.S.C. 371, of International Patent Application No. PCT/CN2019/100940, filed on Aug. 16, 2019, which is based on and claims priority to Chinese patent application No. 201810942162.5 filed on Aug. 17, 2018, disclosure of which is incorporated herein by reference in its entirety.

TECHNICAL FIELD

The present application relates to the field of current limiters and in particular, to a superconducting coil having a spiral structure for a current limiter.

BACKGROUND

The current limiter is a device connected in series in the power grid. The current limiter has low resistance under normal conditions. When a short circuit occurs in the power grid and the line current increases to a certain extent, the resistance of the current limiter increases to limit the short-circuit current.

The key internal structure of the current limiter is a current limiting unit, which is wound from the superconducting tape. In the existing art, a superconducting coil can generally be used as the internal current limiting unit. The superconducting coil consists of two superconducting tapes that are connected to each other inside the superconducting coil. One of the two superconducting tapes is responsible for current inflow, and the other is responsible for current outflow. In order to ensure insulation, an isolation layer is disposed between the two superconducting tapes, and the isolation layer is filled with insulation materials to ensure that no short circuit occurs between the two superconducting tapes. FIG. 1 shows a superconducting coil in the existing art, where 11 and 12 represent two superconducting tapes, and 13 represents an intermediate insulation layer.

One of the common problems in current limiters is the quench, which means that the superconductor suddenly loses its superconducting properties and enters the normal state for some reason. After the quench occurs in the current limiter, the voltage of the superconducting coil is not evenly distributed, but from the spiral center to the outer spiral periphery, the voltage difference between the first superconducting tape and the second superconducting tape gradually increases, and the isolation layer of the superconducting coil of the existing current limiter as shown in FIG. 1 is equally spaced, resulting in the problem that an excessive margin is reserved for the insulation spacing of an inner layer of a superconducting coil of the existing current limiter while the insulation spacing of an outer layer thereof has an insufficient margin.

SUMMARY

The present application provides a superconducting coil having a spiral structure for a current limiter to solve the technical problem that an excessive margin is reserved for the insulation spacing of an inner layer of a superconducting coil of the existing limiter while the insulation spacing of an outer layer thereof has an insufficient margin.

The present application provides a superconducting coil having a spiral structure for a current limiter. The superconducting coil includes a first superconducting tape, a second superconducting tape, and an insulating isolation layer.

The first superconducting tape and the second superconducting tape have spiral structures.

An end of the first spiral center of the first superconducting tape is connected to an end of the second spiral center of the second superconducting tape.

The insulating isolation layer is filled between the first superconducting tape and the second superconducting tape, and a spacing between the first superconducting tape and the second superconducting tape gradually increases from a spiral center to an outer spiral periphery.

Optionally, the first superconducting tape is a Yttrium barium copper oxide (YBCO) coated conductor tape.

Optionally, the second superconducting tape is a YBCO coated conductor tape.

Optionally, an end of the first superconducting tape at the outer spiral periphery is connected to a current lead of an access end of the current limiter.

Optionally, an end of the second superconducting tape at the outer spiral periphery is connected to a current lead of an output end of the current limiter.

Optionally, the connection mode of the end of the first superconducting tape at the outer spiral periphery and the current lead of the access end of the current limiter is electrical connection.

Optionally, the connection mode of the end of the second superconducting tape at the outer spiral periphery and the current lead of the output end of the current limiter is electrical connection.

As can be seen from the preceding solutions, the embodiments of the present application have advantages described below.

In the present application, in accordance with the fact that the voltage of the superconducting coil gradually increases from the spiral center toward the outer spiral periphery, a superconducting coil is configured as a spiral structure having a non-uniform spacing, and an insulation spacing gradually increases from the spiral center toward the outer spiral periphery, thereby solving the problem that an excessive margin is reserved for the insulation spacing of an inner layer of a superconducting coil of the existing current limiter while the insulation spacing of an outer layer thereof has an insufficient margin, improving the overall insulation of the superconducting coil and reducing the risk of breakdown.

DETAILED DESCRIPTION

Embodiments of the present application provide a superconducting coil having a spiral structure for a current limiter to solve the technical problem that an excessive margin is reserved for the insulation spacing of the inner layer of the superconducting coil of the existing limiter while the insulation spacing of the outer layer thereof has an insufficient margin.

To enable the purposes, features and advantages of the present application to be more obvious and easier to understand, solutions in embodiments of the present application will be described clearly and completely in conjunction with the drawings in the embodiments of the present application. Apparently, the embodiments described below are part, not all of the embodiments of the present application. Based on the embodiments in the present application, all other embodiments obtained by those of ordinary skill in the art without creative work are within the scope of the present application.

Figure 1:
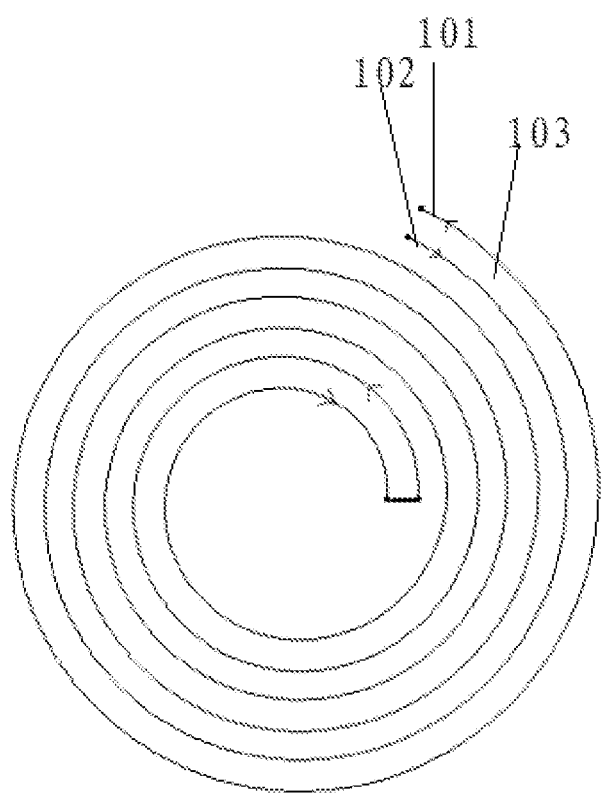
FIG. 1 is a structural view of a superconducting coil in the existing art.
Figure 2:
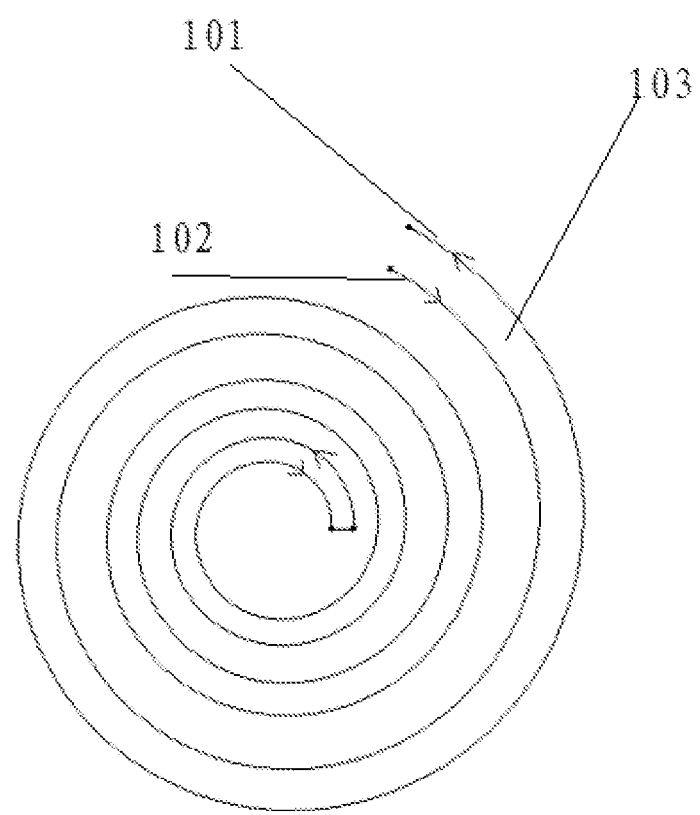
FIG. 2 is a structural view of a superconducting coil having a spiral structure for a current limiter according to the present application.

With reference to FIG. 2, the present application provides a superconducting coil having a spiral structure for a current limiter. The superconducting coil includes a first superconducting tape 102, a second superconducting tape 101, and an insulating isolation layer 103.

The first superconducting tape 102 and the second superconducting tape 101 have spiral structures. An end of the first spiral center of the first superconducting tape 102 is electrically connected to an end of the second spiral center of the second superconducting tape 101.

The insulating isolation layer 103 is filled between the first superconducting tape 102 and the second superconducting tape 101, and a spacing between the first superconducting tape 102 and the second superconducting tape 101 gradually increases from a spiral center to an outer spiral periphery.

Furthermore, the first superconducting tape 102 and the second superconducting tape 101 are a YBCO coated conductor tape.

Furthermore, an end of the first superconducting tape 102 at the outer spiral periphery is electrically connected to a current lead of an access end of the current limiter.

An end of the second superconducting tape 101 at the outer spiral periphery is electrically connected to a current lead of an access end of the current limiter.

It is to be understood that the coil portion of the superconducting coil having the spiral structure for the current limiter provided by the embodiments of the present application consists of two superconducting tapes that are connected to each other inside the superconducting coil and arranged in a spiral structure; one of the two superconducting tapes is for current inflow, and the other is for current outflow; and in order to ensure insulation, there is an isolation layer between the two superconducting tapes, and the isolation layer is filled with insulation materials.

In the embodiments of the present application, in accordance with the practical feature of the voltage distribution of the superconducting coil that the voltage difference gradually increases from inside to outside, the equally spaced isolation layer is changed to a kind of spiral structure similar to the Nautilus, in which the insulation spacing of the inner layer is small and the insulation spacing gradually increases from inside to outside, thereby solving the problem that an excessive margin is reserved for the insulation spacing of the inner layer of the superconducting coil of the existing current limiter while the insulation spacing of the outer layer thereof has an insufficient margin, improving the overall insulation effect of the superconducting coil and reducing the risk of breakdown.

The above are just specific embodiments of the present application and are not intended to limit the scope of the present application. It is easy for those skilled in the art to conceive modifications or substitutions within the scope of the present application. These modifications or substitutions are within the scope of the present application. Therefore, the scope of the present application is subject to the scope of the appended claims.

What is claimed is:

1. A superconducting coil having a spiral structure for a current limiter, comprising: a first superconducting tape, a second superconducting tape, and an insulating isolation layer;

wherein the first superconducting tape and the second superconducting tape have spiral structures;

an end of a first spiral center of the first superconducting tape is connected to an end of a second spiral center of the second superconducting tape;

the insulating isolation layer is filled between the first superconducting tape and the second superconducting tape; and a spacing between the first superconducting tape and the second superconducting tape gradually increases from a spiral center to an outer spiral periphery.

2. The superconducting coil having the spiral structure for the current limiter of claim 1, wherein the first superconducting tape is a Yttrium barium copper oxide (YBCO) coated conductor tape.

3. The superconducting coil having the spiral structure for the current limiter of claim 1, wherein the second superconducting tape is a YBCO coated conductor tape.

4. The superconducting coil having the spiral structure for the current limiter of claim 1, wherein an end of the first superconducting tape at the outer spiral periphery is connected to a current lead of an access end of the current limiter.

5. The superconducting coil having the spiral structure for the current limiter of claim 1, wherein an end of the second superconducting tape at the outer spiral periphery is connected to a current lead of an output end of the current limiter.

6. The superconducting coil having the spiral structure for the current limiter of claim 3, wherein an end of the first superconducting tape at the outer spiral periphery is connected to the current lead of the access end of the current limiter, and a connection mode is electrical connection.

7. The superconducting coil having the spiral structure for the current limiter of claim 4, wherein an end of the second superconducting tape at the outer spiral periphery is connected to the current lead of the output end of the current limiter, and a connection mode is electrical connection.

8. The superconducting coil having the spiral structure for the current limiter of claim 1, wherein the end of the first spiral center of the first superconducting tape is electrically connected to the end of the second spiral center of the second superconducting tape.

* * * * *